United States Patent
Kushima

(10) Patent No.: US 9,566,919 B2
(45) Date of Patent: Feb. 14, 2017

(54) SHIELD STRUCTURE FOR WIRE HARNESS

(71) Applicant: SUMITOMO WIRING SYSTEMS, LTD., Mie (JP)

(72) Inventor: Takao Kushima, Mie (JP)

(73) Assignee: SUMITOMO WIRING SYSTEMS, LTD., Mie (JP)

( * ) Notice: Subject to any disclaimer, the term of this patent is extended or adjusted under 35 U.S.C. 154(b) by 0 days.

(21) Appl. No.: 14/924,991

(22) Filed: Oct. 28, 2015

(65) Prior Publication Data

US 2016/0134090 A1    May 12, 2016

(30) Foreign Application Priority Data

Nov. 6, 2014 (JP) ................. 2014-225834

(51) Int. Cl.
*H02G 3/04* (2006.01)
*B60R 16/02* (2006.01)
*H05K 9/00* (2006.01)

(52) U.S. Cl.
CPC ......... *B60R 16/0215* (2013.01); *H02G 3/0481* (2013.01); *H05K 9/0098* (2013.01)

(58) Field of Classification Search
CPC ................................................. H05K 9/0098
See application file for complete search history.

(56) References Cited

U.S. PATENT DOCUMENTS

| | | | | |
|---|---|---|---|---|
| 2003/0042032 A1* | 3/2003 | Syed | .................... | H02G 3/0481 174/36 |
| 2009/0145655 A1* | 6/2009 | Gladd | .................. | H05K 9/0098 174/378 |
| 2010/0126752 A1* | 5/2010 | Watanabe | ............ | H05K 9/0098 174/102 D |
| 2012/0312595 A1* | 12/2012 | Sawada | ............... | B60R 16/0215 174/72 A |
| 2013/0026826 A1* | 1/2013 | Adachi | ............... | B60R 16/0207 307/9.1 |
| 2013/0032393 A1* | 2/2013 | Toyama | .............. | B60R 16/0215 174/72 A |
| 2013/0306346 A1* | 11/2013 | Izawa | .................. | H02G 3/0468 174/102 R |
| 2014/0202728 A1* | 7/2014 | Fukuda | .................. | H01R 4/646 174/78 |

FOREIGN PATENT DOCUMENTS

JP     2007-287335     11/2007

* cited by examiner

*Primary Examiner* — Hung V Ngo
(74) *Attorney, Agent, or Firm* — Greenblum & Bernstein, P.L.C.

(57) ABSTRACT

A connecting position of a braid portion relative to a shield pipe is stabilized. A shield pipe in which a conductive wire constituting a wire harness is inserted, a braid portion that is connected to an end portion of the shield pipe and in which the conductive wire that is extended out of the shield pipe is inserted, an end member that is formed of a conductive material and that is mounted to an outer circumferential surface of the shield pipe while covering an end surface of the shield pipe, the braid portion being connected to an outer circumferential surface of the end member, and a crimp ring that crimps the braid portion onto the end member are provided. A positioning groove for positioning the crimp ring in an axial direction is formed on the outer circumferential surface of the end member.

6 Claims, 4 Drawing Sheets

SHIELD STRUCTURE FOR WIRE HARNESS

TECHNICAL FIELD

The present invention relates to a shield structure for a wire harness.

BACKGROUND ART

Conventionally, in hybrid vehicles or electric automobiles, there are cases where a wire harness constituted by a plurality of wires is routed between a battery and an inverter in a state in which the wire harness is inserted in a metal shield pipe. An example of such a wire harness is disclosed in JP 2007-287335A.

The aforementioned wire harness is inserted in a shield pipe that is routed along an under-floor area of a vehicle. On the other hand, in a portion of the wires that is led out of the shield pipe, that is, in a region where the wires are routed toward the battery or the inverter, the wires are inserted in a metal braid portion, which serves as a flexible shielding member, so that the routing direction can be adjusted freely.

JP 2007-287335A is an example of related art.

In the above-described structure, the metal braid portion is connected to the shield pipe by placing the metal braid portion so as to cover an end portion of the shield pipe and, in this state, tightening a ring-shaped crimp member.

However, in the above-described structure, no measure for defining the tightening position (crimping position) of a crimping tool relative to the shield pipe is taken. Therefore, conventionally, the tightening position of the crimping tool is determined after manually measuring the distance from an end edge of the shield pipe, and thus it is not possible to perform the operation efficiently.

SUMMARY OF THE INVENTION

The present invention was made based on circumstances such as those described above, and it is an object thereof to provide a shield structure for a wire harness that makes it possible to easily determine a tightening position of a crimp member relative to a shield pipe.

A shield structure for a wire harness according to the present invention includes a shield pipe in which a conductive wire constituting a wire harness is inserted, a tube-shaped flexible shield member that is connected to an end portion of the shield pipe and in which the conductive wire that is extended out of the shield pipe is inserted, an end member that is formed of a conductive material and that is mounted to an outer circumferential surface of the shield pipe while covering an end surface of the shield pipe, the flexible shield member being connected to an outer circumferential surface of the end member, and a crimp member that crimps the flexible shield member onto the end member, wherein a positioning portion for positioning the crimp member in an axial direction of the shield pipe is formed on the outer circumferential surface of the end member.

According to the present invention, the wire harness is surrounded by the shield pipe and the flexible shield member and is kept in a shielded state. Moreover, since the end surface of the shield pipe is covered by the end member, even if the end edge of the shield pipe is a sharp edge, the occurrence of a situation in which a coating of the conductive wire is damaged can be avoided. Moreover, since the end member is attached in such a manner as to cover the end edge of the shield pipe, the position of the end member relative to the shield pipe is fixed, and since the crimp member is disposed in the positioning portion that is formed in the end member, the tightening position of the crimp member relative to the shield pipe can be determined automatically. Thus, the working efficiency can be increased.

EMBODIMENTS OF THE INVENTION

The following is a description of preferred modes of the present invention.

(1) In the shield structure for a wire harness of the present invention, it is preferable that the end member is formed of a conductive resin material.

With this configuration, the flexible shield member and the shield pipe can be electrically connected to each other via the end member.

(2) Moreover, a configuration is also possible in which a protective member that surrounds the flexible shield member in a lengthwise direction and a sealing grommet that is disposed to extend between the shield pipe and the protective member while surrounding the flexible shield member are further provided, and a pipe seal portion is formed on an inner circumferential surface of the end member, the pipe seal portion coming into close contact with the outer circumferential surface of the shield pipe around the entire circumference thereof in a watertight state.

With this configuration, a gap between the end member and the shield pipe can be sealed by the pipe seal portion that is formed in the end member.

(3) Furthermore, it is also possible that the end member has a wall surface that covers the end surface of the shield pipe, a wire seal portion made of rubber through which the conductive wire passes in a sealed state is formed in the wall surface, and the wire seal portion is integrally incorporated into the end member by coinjection molding.

With this configuration, a gap between the conductive wire and the end member can be sealed by the wire seal portion. Thus, even if the protective member is damaged and water enters the inside thereof, the entry of water to the inside of the shield pipe can be avoided.

Next, embodiments of the shield structure for a wire harness according to the present invention will be described with reference to the drawings.

Embodiment 1

A shield structure for a wire harness of Embodiment 1 is applied to a hybrid vehicle.

Figure 1:
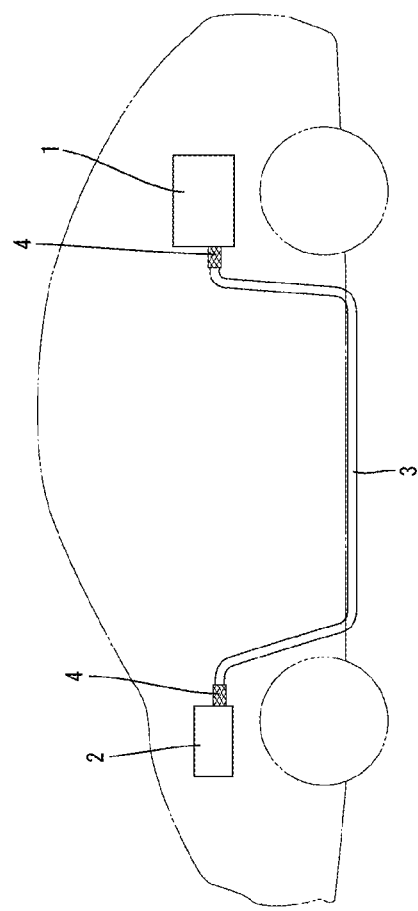
FIG. 1 is a side view briefly showing a situation in which, in a hybrid vehicle, a battery and an inverter are connected to each other via a wire harness.
Figure 2:
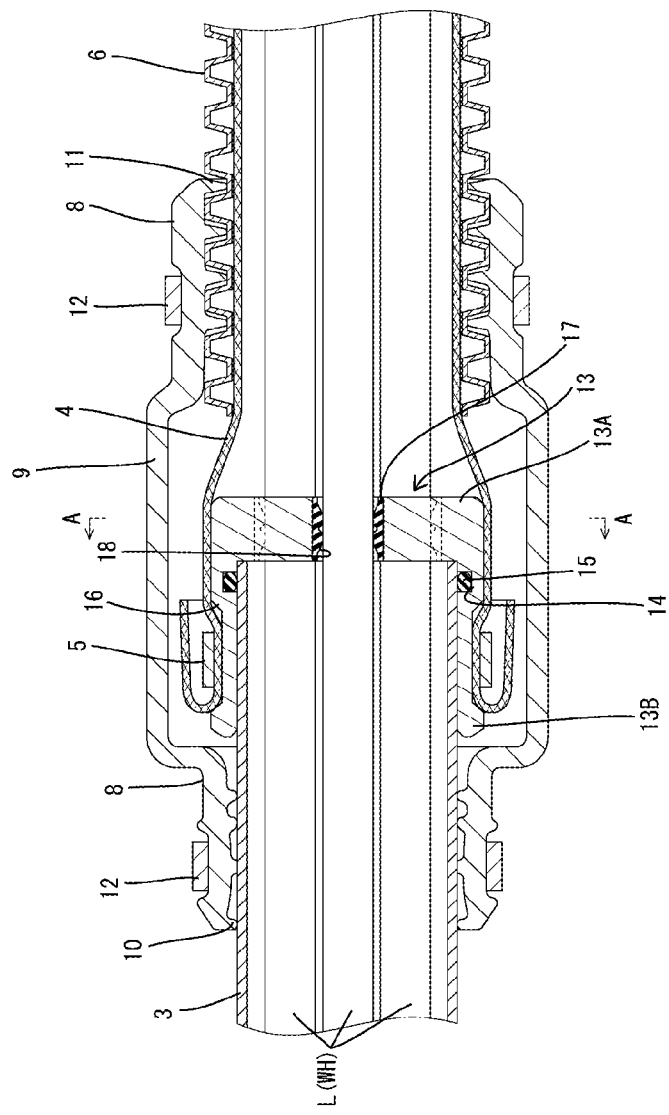
FIG. 2 is a side cross-sectional view showing a connecting portion between a shield pipe and a braid portion.

A wire harness WH connects a battery 1 that is installed on a rear side of the vehicle and an inverter 2 that is provided in an engine compartment to each other. In the case of the present embodiment, as shown in FIG. 2, the wire harness WH is constituted by three flexible conductive wires L.

An intermediate portion of the wire harness WH is collectively inserted in a shield pipe 3 that is disposed in an under-floor area of the vehicle. The shield pipe 3 is made of aluminum or an aluminum alloy and is composed of an elongated pipe having a circular cross-sectional shape. The shield pipe 3 is bent to be routed along a predetermined pipe arrangement route. The shield pipe 3 generally extends horizontally in a substantially front-rear direction of the vehicle. A front end side of the shield pipe 3 is bent upward to be introduced into the engine compartment, and a rear end side thereof is introduced into a rear side of a cabin.

End members 13 are mounted to opposite end portions of the shield pipe 3. Each end member 13 is formed of a wire holding portion 13A that covers the entire end surface of the shield pipe 3 and a pipe holding portion 13B that protrudes in an axial direction from a circumferential edge portion of this wire holding portion 13A so as to have a tube shape and that can be fitted to an outer circumferential surface of the shield pipe 3. The end members 13 are formed using, as the main material, a resin material containing a conductive material. Therefore, when a braid portion 4 is crimped onto an end member 13, the braid portion 4 is electrically connected to the shield pipe 3 via the end member 13.

Figure 3:
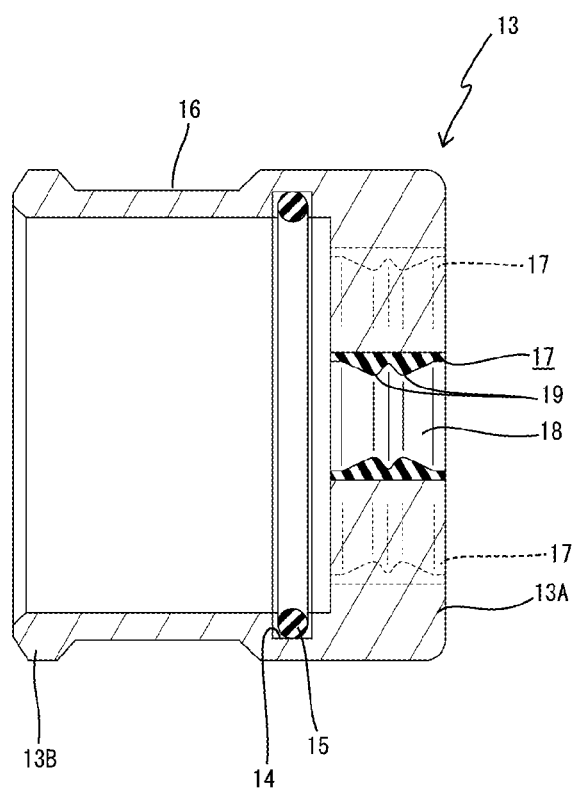
FIG. 3 is a side cross-sectional view of an end member.

As shown in FIG. 3, an inner circumferential surface of the pipe holding portion 13B at a position that is near the wire holding portion 13A is recessed around the entire circumference to form a mounting groove 14. A gap between the end member 13 and the shield pipe 3 is sealed by an O-ring 15 attached to this mounting groove 14. On the other hand, an outer circumferential surface of the pipe holding portion 13B in a region between an area where the O-ring 15 is provided and an opening side is recessed around the entire circumference to form a positioning groove 16. A crimp ring 5 (crimp member), which will be described later, can be disposed in this positioning groove 16 in a state in which the crimp ring 5 is positioned with respect to the axial direction (front-rear direction), and the braid portion 4 can be tightened at this position.

Figure 4:
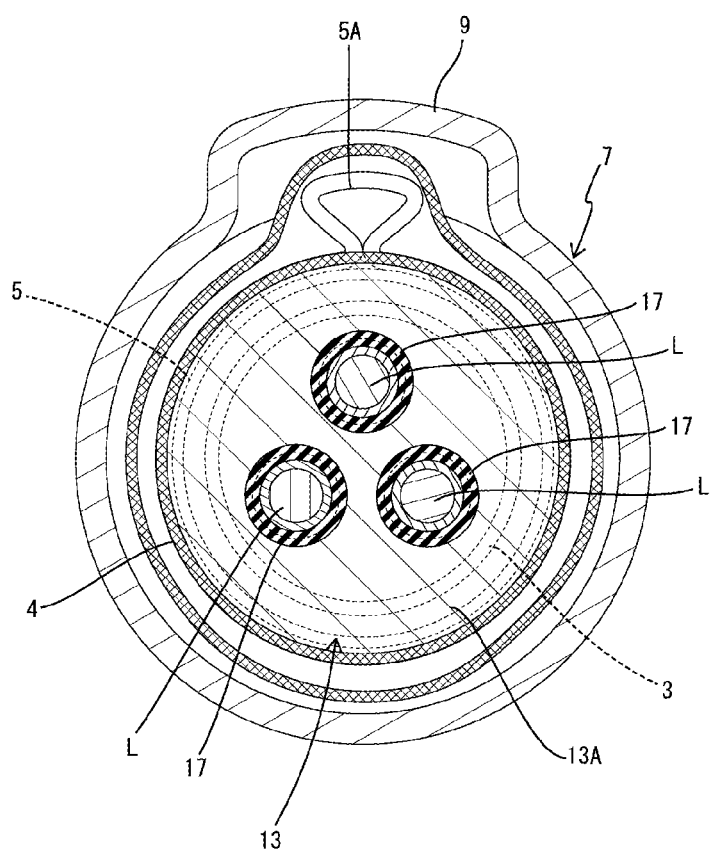
FIG. 4 is a cross-sectional view taken along line A-A in FIG. 2.

Three wire seal portions 17 in which respective conductive wires L can be inserted in a sealed state are provided in the wire holding portion 13A. As shown in FIG. 4, the wire seal portions 17 are arranged coaxially around the central axis of the end member 13. The wire seal portions 17 are formed of a rubber material and are integrally incorporated into the end member 13 by a molding method such as coinjection molding. A wire insertion hole 18 in which the corresponding conductive wire L can be inserted is formed penetrating each wire seal portion 17, and as shown in FIG. 3, in a central portion of the inside of the wire insertion hole 18 with respect to the axial direction, two sealing ridges 19 on the front side and the rear side are formed protruding therefrom. The sealing ridges 19 are each formed into an annular shape extending in a circumferential direction, and come into elastic contact with a coating of the conductive wire L in a watertight state. The entry of water to the inside of the shield pipe 3 is thus avoided.

The wire harness WH is led out from the opposite end portions of the shield pipe 3 with respect to a longitudinal direction thereof. Those portions of the wire harness WH that are led out of the shield pipe 3 are inserted in respective braid portions 4 (flexible shield members). The braid portions 4 are formed by interweaving multiple conductive metal strands into an elongated tube shape, and each have favorable flexibility as a whole. As shown in FIG. 2, an end portion of each of the two braid portions 4 that is located on the shield pipe 3 side is placed to cover an outer circumferential surface of the corresponding end member 13, and is tightened and fixed thereto using the metal crimp ring 5 on the outer circumference of the positioning groove 16. In this case, the crimp ring 5 is positioned within the width of the positioning groove 16 in the front-rear direction, and therefore the tightening position of the braid portion 4 relative to the shield pipe 3 is stable. Moreover, the braid portion 4 is folded back in a rearward direction in a state in which it is crimped by the crimp ring 5, and thus the end portion of the braid portion 4 is prevented from being caught between a grommet 7 and the shield pipe 3.

It should be noted that the crimp ring 5 is a known member in which a crimp operating portion 5A is formed protruding outward in a radial direction. The braid portion 4 can be tightened and fixed to the end member 13 by reducing the diameter of the crimp ring 5 by performing crimping such that base portions of the crimp operating portion 5A are brought close to each other.

Moreover, a corrugated tube 6 serving as a protective member is disposed on the outer circumferential side of the braid portion 4.

As shown in FIG. 2, an end portion of the corrugated tube 6 is located at a predetermined distance from the end portion of the shield pipe 3. The corrugated tube 6 is made of a synthetic resin and is formed into a tube shape that is continuous around the entire circumference. Moreover, the corrugated tube 6 is formed into an accordion tube shape having alternate ridges and grooves in its lengthwise direction, and has favorable flexibility as a whole.

Furthermore, the sealing grommet 7 bridges between the corrugated tube 6 and the shield pipe 3. The grommet 7 is formed of a rubber material. Cylindrical tube portions 8 are formed at both end portions of the grommet 7. An accommodating portion 9 bulging radially outward is formed between the two tube portions 8. The above-described crimp operating portion 5A and the folded-back end portion of the braid portion 4 are accommodated in the accommodating portion 9. One of the tube portions 8 (tube portion on the left side in FIG. 2) of the grommet 7 is fitted to the outer circumferential surface of the end portion of the shield pipe 3, and the other tube portion 8 (tube portion on the right side in FIG. 2) is fitted to the outer circumferential surface of the end portion of the corrugated tube 6. A plurality of seal lips 10 are formed protruding from an inner circumferential surface of the tube portion 8 on the shield pipe 3 side and extending around the entire circumference. In the present embodiment, a total of four seal lips 10 are formed respectively in a position at a leading end of this tube portion 8 and in three other positions that are located farther inward. A plurality of seal edges 11 are formed protruding from an inner circumferential surface of the tube portion 8 on the corrugated tube 6 side and extending around the entire circumference. In the present embodiment, a total of four seal edges 11 are formed respectively in a position at a leading end of this tube portion 8 and in three other positions that are located farther inward. The seal edges 11 are formed with the same pitch as that of the grooves of the corrugated tube 6 and can be inserted into the corresponding grooves.

Cable ties 12 are disposed on the outer circumferential surfaces of both of the two tube portions 8 of the grommet 7. Since the cable ties 12 are known cable ties made of resin, a detailed description thereof is omitted. The grommet 7 can be connected to the shield pipe 3 or the corrugated tube 6 by tightening the corresponding cable tie 12. Moreover, at this time, the tightening force of the cable tie 12 acts on the seal lips 10 or the seal edges 11 to bring them into elastic contact with the shield pipe 3 or the corrugated tube 6, and thus the sealed state is enhanced.

Next, effects of the present embodiment that is configured as described above will be described. First, an example of the operation of forming the shield structure of the present embodiment will be described. The conductive wires L are inserted in the shield pipe 3 and are also inserted in the respective wire insertion holes 18 of each end member 13. After that, the pipe holding portion 13B of the end member 13 is fitted to the shield pipe 3 until the wire holding portion 13A abuts against the end edge of the shield pipe 3. Thus, the mounting position of the end member 13 relative to the shield pipe 3 is determined.

On the other hand, the end portion of the braid portion 4 in which the conductive wires L are inserted is fitted to the outer circumferential side of the end member 13. In this state, the crimp ring 5 is placed in the positioning groove 16, and the crimp operating portion 5A is crimped to thereby tighten and fix the braid portion 4 to the end member 13. During this operation, the crimp ring 5 is positioned with respect to the front-rear direction by the positioning groove 16. As a result, the tightening position of the braid portion 4 relative to the shield pipe 3 is automatically determined. If the tightening position of the crimp ring 5 relative to the shield pipe 3 varies in the front-rear direction, the position of the crimp operating portion 5A in the front-rear direction also varies, resulting in the problem of the crimp operating portion 5A interfering with the accommodating portion 9 of the grommet 7, in which the crimp operating portion 5A is accommodated. In this respect, according to the present embodiment, the position of the crimp operating portion 5A of the crimp ring 5 relative to the shield pipe 3 in the front-rear direction can be stabilized, and thus the crimp operating portion 5A can be easily and smoothly accommodated in the accommodating portion 9 of the grommet 7.

It should be noted that when the operation of tightening the crimp ring 5 is completed, the end of the braid portion 4 is folded back as shown in FIG. 2. After that, the grommet 7 (the grommet 7 is fitted to a position in advance in which it is displaced to the shield pipe 3 side or the corrugated tube 6 side) is disposed to extend between the shield pipe 3 and the corrugated tube 6, in which the braid portion 4 is inserted. Then, the tube portions 8 are tightened using the cable ties 12 and thus connected to the shield pipe 3 or the corrugated tube 6 in a sealed state.

Effects of the present embodiment are as described below. Since the position of the crimp ring 5 relative to the shield pipe 3 in the front-rear direction is automatically determined by the end member 13, the crimp operating portion 5A can be easily and smoothly accommodated in the accommodating portion 9 of the grommet 7 without interfering with the accommodating portion 9.

Moreover, since the end member 13 is formed of a material containing a conductive material, the braid portion 4 and the shield pipe 3 can be electrically connected to each other in a simple manner.

Furthermore, since a configuration in which the end edge of the shield pipe 3 is concealed by the wire holding portion 13A of the end member 13 is adopted, the occurrence of a situation in which the coatings of the conductive wires L are damaged by the edge of the end surface of the shield pipe 3 is also avoided in advance.

Furthermore, since the end member 13 is mounted to the shield pipe 3 in a sealed state, and the conductive wires L are also sealed by providing the wire seal portions 17, even if the corrugated tube 6 is damaged and water enters from the outside, the entry of water to the inside of the shield pipe 3 is reliably avoided. Accordingly, the occurrence of a situation in which rust is formed on the shield pipe 3 can be avoided in advance. Furthermore, since the wire seal portions 17 are integrally incorporated into the end member 13 by coinjection molding, the number of parts is not increased, and the ease of handling is excellent.

Other Embodiments

The present invention is not limited to the foregoing embodiments that are described above with reference to the drawings. For example, embodiments such as those described below are also covered by the technical scope of the present invention.

(1) In the foregoing embodiments, the shield pipe 3 made of metal is described. However, the shield pipe 3 may be composed of a synthetic resin serving as the main ingredient, and a shield layer made of metal foil, for example, may be inserted inside the shield pipe 3 so as to provide a shielding function.

(2) In the foregoing embodiments, the end member 13 is recessed to form the positioning groove. However, a configuration may also be adopted in which, instead of the positioning groove, annular ridges that are spaced apart from each other in the front-rear direction are formed protruding from the end member 13, and the crimp ring 5 is positioned between these annular ridges.

(3) In the foregoing embodiments, the crimp ring 5 made of metal is used as the crimp member. However, a cable tie made of resin may be used as well.

(4) It is also possible to wrap tape around a portion of the wire harness that is led out of the end member 13 to the corrugated tube side. With this configuration, even when the corrugated tube side of the wire harness is bent while the wire harness is routed, the bend is unlikely to affect the seal portion. Thus, this configuration contributes to the enhancement of the sealing function.

What is claimed is:

1. A shield structure for a wire harness, the shield structure comprising:
   a shield pipe in which a conductive wire constituting a wire harness is inserted;
   a tube-shaped flexible shield member that is connected to an end portion of the shield pipe and in which the conductive wire that is extended out of the shield pipe is inserted;
   an end member that is formed of a conductive material and that is mounted to an outer circumferential surface of the shield pipe while covering an end surface of the shield pipe, the flexible shield member being connected to an outer circumferential surface of the end member; and
   a crimp member that crimps the flexible shield member onto the end member,
   wherein a positioning portion for positioning the crimp member in an axial direction of the shield pipe is formed on the outer circumferential surface of the end member.

2. The shield structure for a wire harness according to claim 1,
   wherein the end member is formed of a conductive resin material.

3. The shield structure for a wire harness according to claim 2, further comprising:
   a protective member that surrounds the flexible shield member in a lengthwise direction; and
   a sealing grommet that is disposed to extend between the shield pipe and the protective member while surrounding the flexible shield member,
   wherein a pipe seal portion is formed on an inner circumferential surface of the end member, the pipe seal portion coming into close contact with the outer circumferential surface of the shield pipe around the entire circumference thereof in a watertight condition.

4. The shield structure for a wire harness according to claim 3,
wherein the end member has a wall surface that covers the end surface of the shield pipe, a wire seal portion made of rubber through which the conductive wire passes in a sealed condition is formed in the wall surface, and the wire seal portion is integrally incorporated into the end member by coinjection molding.

5. The shield structure for a wire harness according to claim 1, further comprising:
a protective member that surrounds the flexible shield member in a lengthwise direction; and
a sealing grommet that is disposed to extend between the shield pipe and the protective member while surrounding the flexible shield member,
wherein a pipe seal portion is formed on an inner circumferential surface of the end member, the pipe seal portion coming into close contact with the outer circumferential surface of the shield pipe around the entire circumference thereof in a watertight condition.

6. The shield structure for a wire harness according to claim 5,
wherein the end member has a wall surface that covers the end surface of the shield pipe, a wire seal portion made of rubber through which the conductive wire passes in a sealed condition is formed in the wall surface, and the wire seal portion is integrally incorporated into the end member by coinjection molding.

* * * * *